United States Patent
Revanna

(10) Patent No.: US 7,075,374 B2
(45) Date of Patent: Jul. 11, 2006

(54) METHOD AND APPARATUS TO PROVIDE WIDEBAND LOW NOISE AMPLIFICATION

(75) Inventor: Guruprasad Shimoga Revanna, Bangalore (IN)

(73) Assignee: Intel Corporation, Santa Clara, CA (US)

( * ) Notice: Subject to any disclaimer, the term of this patent is extended or adjusted under 35 U.S.C. 154(b) by 64 days.

(21) Appl. No.: 10/871,764

(22) Filed: Jun. 17, 2004

(65) Prior Publication Data

US 2005/0280472 A1    Dec. 22, 2005

(51) Int. Cl.
*H03F 3/04* (2006.01)
(52) U.S. Cl. .................................. 330/302; 330/133
(58) Field of Classification Search ............... 330/302, 330/133; 455/253.1, 253.2, 241.1, 236.1
See application file for complete search history.

(56) References Cited

U.S. PATENT DOCUMENTS

| | | | | |
|---|---|---|---|---|
| 5,933,057 A * | 8/1999 | Tchamov et al. | ............ | 330/302 |
| 6,285,865 B1 * | 9/2001 | Vorenkamp et al. | ......... | 455/307 |
| 6,509,799 B1 * | 1/2003 | Franca-Neto | ............... | 330/305 |
| 6,771,124 B1 * | 8/2004 | Ezell | ........................... | 330/129 |
| 6,819,936 B1 * | 11/2004 | Weissman | .................... | 455/522 |

* cited by examiner

*Primary Examiner*—Patricia Nguyen
(74) *Attorney, Agent, or Firm*—The Law Offices of John C. Scott, LLC

(57) ABSTRACT

Wideband low noise amplification is achieved using a serial chain of relatively narrowband LNAs. Each of the narrowband LNAs amplifies a different portion of the overall bandwidth of the wideband amplification system. In at least one embodiment, a buffer amplifier is provided at the end of the chain of LNAs to provide impedance matching over the extended bandwidth.

24 Claims, 4 Drawing Sheets

METHOD AND APPARATUS TO PROVIDE WIDEBAND LOW NOISE AMPLIFICATION

TECHNICAL FIELD

The invention relates generally to amplifiers and, more particularly, to low noise amplifiers for use in communications applications.

DETAILED DESCRIPTION

Figure 1:
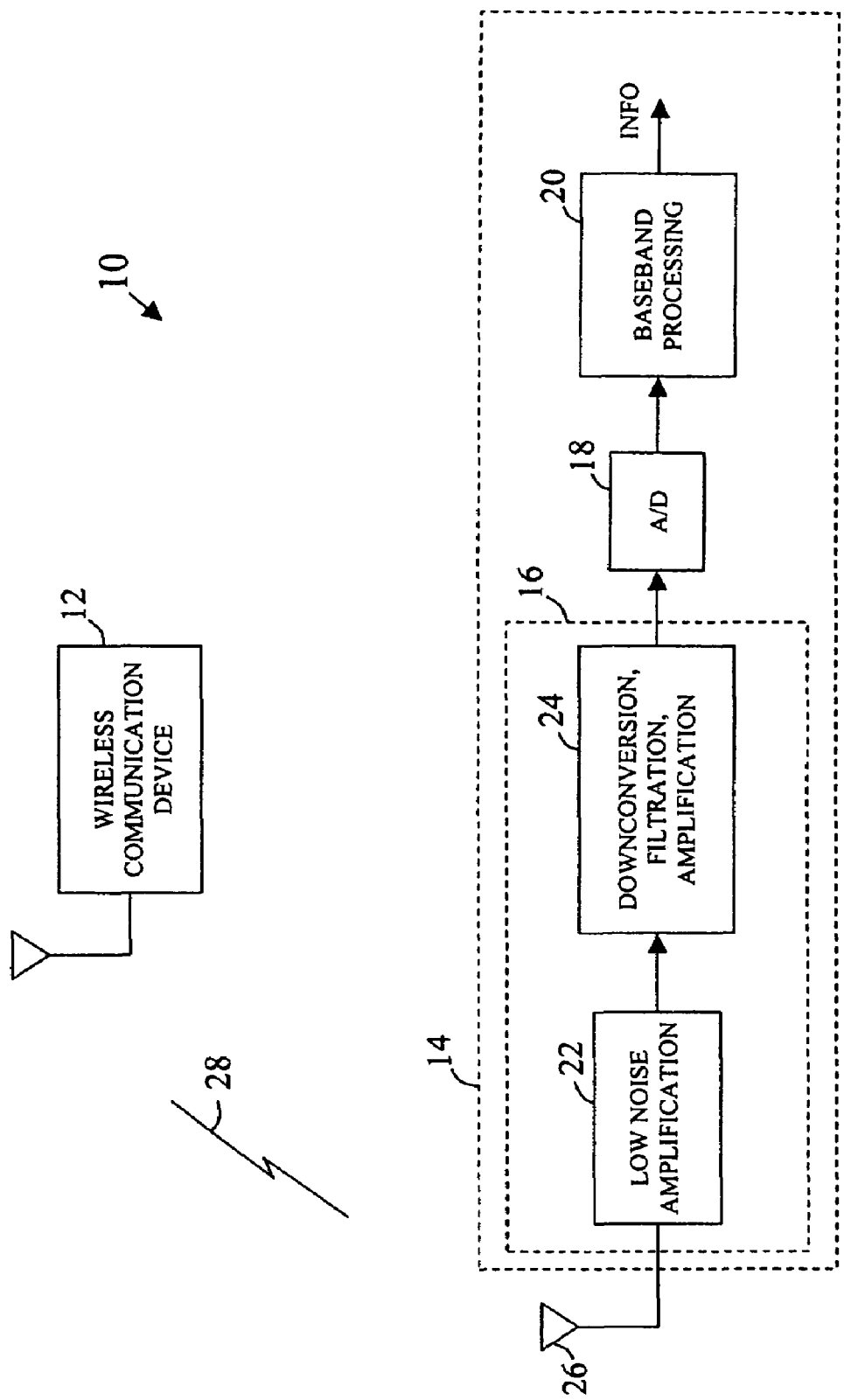
FIG. 1 is a diagram illustrating an example wireless communication arrangement that may utilize features of the present invention.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein in connection with one embodiment may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

A current trend in the wireless communication industry is toward higher data rates. To support these higher data rates, radio frequency components and subsystems need to be developed that are capable of operating over wider bandwidths. One type of component that is of particular interest in a wideband system is the low noise amplification portion of a wireless receiver. Low noise amplification is often performed at the input of a wireless receiver to provide a high degree of amplification at a relatively low noise figure. By providing high gain with a relatively low noise figure early in the receiver processing, the impact of noise in later portions of the receive channel may be reduced. In at least one aspect of the present invention, a relatively wideband low noise amplification system is provided.

FIG. 1 is a diagram illustrating an example wireless communication arrangement 10 that may utilize features of the present invention. As illustrated, the wireless communication arrangement 10 includes a first wireless communication device 12 that is communicating with a second wireless communication device 14 via a wireless link 28. The first and second wireless communication devices 12, 14 may each comprise any type of device or system that is capable of supporting wireless communication including, for example, a laptop, desktop, palmtop, or tablet computer having wireless networking capability, a personal digital assistant having wireless networking capability, a cellular telephone or other handheld wireless communicator, a pager, a satellite communicator, a wireless access point, a cellular base station, and/or others.

As shown in FIG. 1, the wireless communication device 14 may include one or more of: a radio frequency (RF) receiver 16, an analog to digital (A/D) converter 18, a baseband processing unit 20, and one or more antennas 26. The one or more antennas 26 may receive an RF signal from a wireless channel. Any type of antenna(s) may be used including, for example, a dipole antenna, a patch antenna, a helical antenna, an antenna array, and/or others, including combinations of the above. The RF receiver 16 is operative for processing the received RF signal to generate a baseband signal at an output thereof. The A/D converter 18 converts the baseband signal to a digital representation. The baseband processing unit 20 may then process the digitized baseband signal to recover any information therein. Although not shown, the wireless communication device 14 may also include transmitter functionality.

As illustrated in FIG. 1, the RF receiver 16 may include a low noise amplification system 22 to provide low noise amplification to a received signal. The RF receiver 16 may also include functionality 24 for downconverting, filtering, and/or further amplifying the output signal of the low noise amplification system 22 to generate the baseband signal. Any type of receiver architecture may be used (e.g., direct conversion, super heterodyne, etc.). In at least one embodiment of the invention, the wireless communication device 14 may be a wireless network interface module (e.g., a wireless NIC) that may be installed within a larger system or device.

Figure 2:
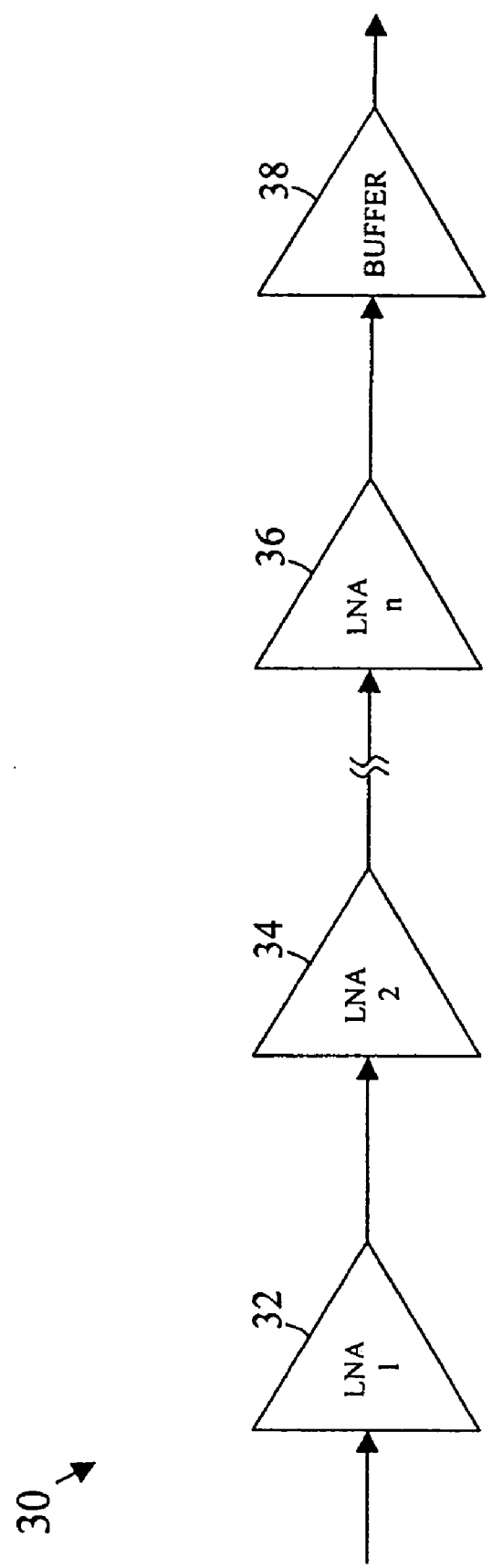
FIG. 2 is a block diagram illustrating an example low noise amplification system in accordance with an embodiment of the present invention.

FIG. 2 is a block diagram illustrating an example low noise amplification system 30 in accordance with an embodiment of the present invention. The low noise amplification system 30 is capable of providing low noise amplification over a relatively wide operational bandwidth. The low noise amplification system 30 maybe used within, for example, the wireless communication device 14 of FIG. 1 or in any other wireless device that requires wide band low noise amplification. As illustrated in FIG. 2, the low noise amplification system 30 includes two or more low noise amplifiers (LNAs) 32, 34, 36 that are arranged in a serial configuration so that the output of each amplifier forms the input of the next amplifier in the chain. The LNAs 32, 34, 36 each have a relatively low noise figure (e.g., 1.5 dB or less). Each of the LNAs 32, 34, 36 may be narrower band amplifiers that provide elevated gain in only a portion of the overall bandwidth of the low noise amplification system 30. In at least one embodiment of the invention, the gain characteristics of the individual LNAs 32, 34, 36 may be designed so that the overall gain of the low noise amplification system 30 is approximately flat over an extended bandwidth.

In at least one implementation, the low noise amplification system 30 may also include a buffer amplifier 38 at an output end of the serial chain of amplifiers to provide for impedance matching over the full bandwidth of the system.

The buffer amplifier 38 may have a relatively flat gain over the entire operational bandwidth of the system 30. The buffer amplifier 38 may be a low gain component and does not have to have a low noise figure. In at least one embodiment of the invention, no buffer amplifier is used.

As described above, each of the LNAs 32, 34, 36 in the serial chain may be narrower band amplifiers that provide elevated gain in only a portion of the operational bandwidth of the system 30. Each of the LNAs 32, 34, 36 may be tuned at a different center frequency within the operational bandwidth of the system 30 than the other LNAs. In at least one embodiment of the invention, the LNA at the beginning of the serial chain (e.g., LNA 1 in FIG. 2) will have the highest center frequency amongst the LNAs of the low noise amplification system 30. Each successive LNA after the initial LNA may then be tuned at a consecutively lower center frequency than a previous LNA. By placing the higher frequency LNA(s) toward the beginning of the serial chain, the overall noise figure of the system 30 may be made flatter over the operational bandwidth thereof. It should be appreciated, however, that others techniques for arranging the LNAs may alternatively be used.

The number of LNAs used in a particular implementation may be selected based on the overall bandwidth to be achieved. For example, to achieve a wider overall bandwidth, a higher number of LNAs may be used. To enhance gain flatness over the operational bandwidth of the system, appropriate LNA gains and separations between the center frequencies of the individual LNAs may be chosen.

The LNAs 32, 34, 36 and the buffer amplifier 38 of the low noise amplification system 30 may be implemented using any type of semiconductor technology. In at least one embodiment of the invention, complementary metal-oxide semiconductor (CMOS) technology is used for all amplifiers. The low noise amplification system 30 may be implemented using discrete components, as part of an integrated low noise amplification component (e.g., a radio frequency integrated circuit (RFIC) low noise amplification chip), as part of a larger integrated system (e.g., an integrated wireless receiver, an integrated wireless transceiver, an integrated wireless network interface circuit, etc.), and/or in other ways.

Figure 3:
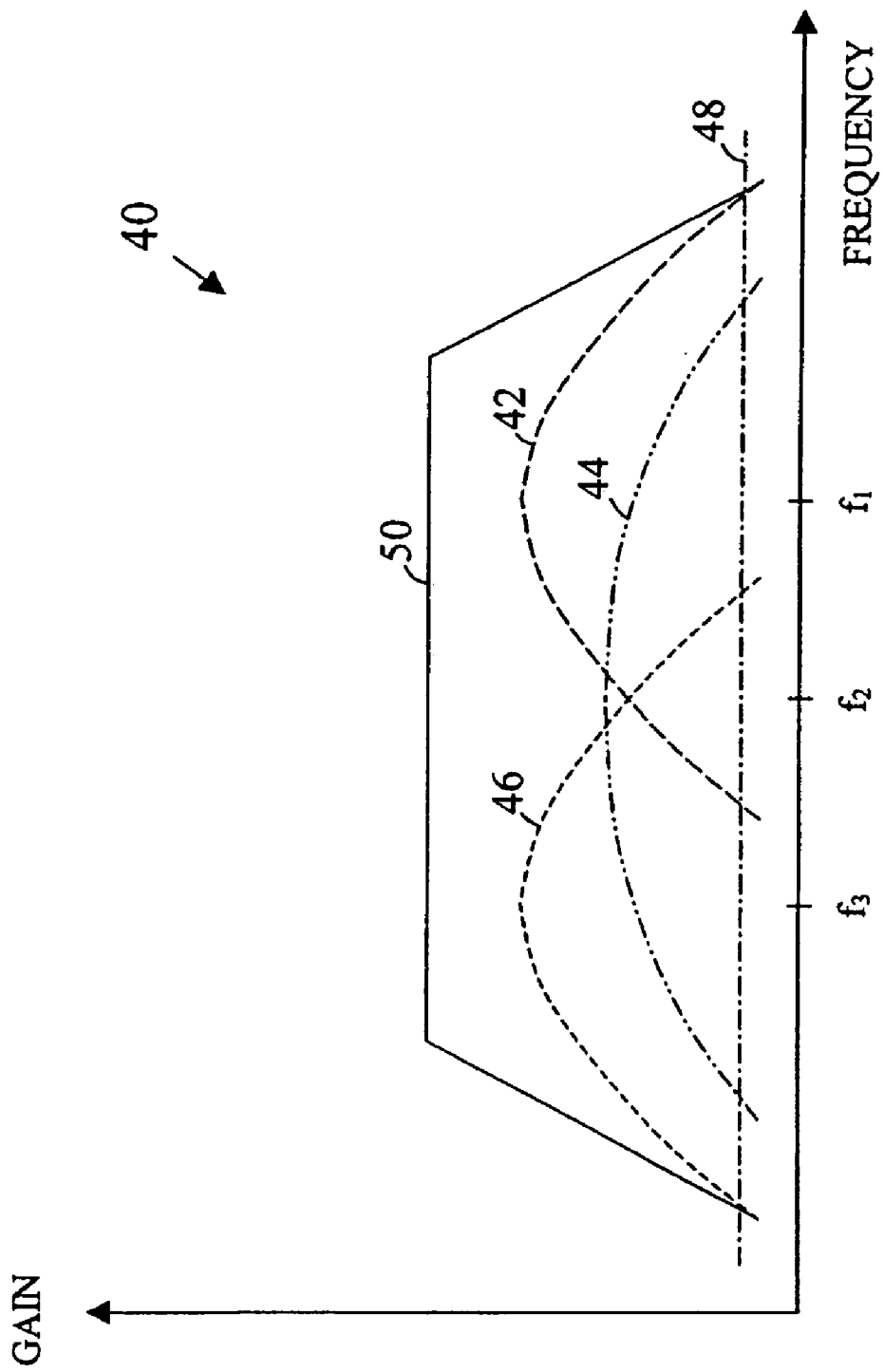
FIG. 3 is a gain-frequency plot illustrating the gain characteristics of various elements in an example low noise amplification system having three serially connected LNAs in accordance with an embodiment of the present invention.

FIG. 3 is a gain-frequency plot 40 illustrating the gain characteristics of various elements within an example three LNA low noise amplification system in accordance with an embodiment of the present invention. As shown, the plot 40 includes gain characteristics 42, 44, 46 for three serially connected LNAs and a gain characteristic 48 for a buffer amplifier that is also serially connected. The plot 40 also includes a gain characteristic 50 for the overall low noise amplification system, which is a combination of the other gain profiles. As shown, the gain characteristics 42, 44, 46 for the three LNAs are each relatively narrowband compared to the overall bandwidth of the system. The gain characteristic 42 for an LNA at the beginning of the serial chain has a center frequency $f_1$, the gain characteristic 44 for the next LNA in the chain has a center frequency $f_2$, and the gain characteristic 46 for the last LNA in the chain has a center frequency $f_3$. The gain characteristic 48 for the buffer amplifier is relatively low gain and relatively flat over the operational bandwidth of the system. As illustrated, the composite gain characteristic 50 of the system is relatively wide band and flat over the operational bandwidth of the system. It should be appreciated, however, that a certain degree of gain variability may exist within the operational bandwidth of a low noise amplification system in accordance with the present invention (i.e., the overall gain characteristic may only be approximately flat).

Figure 4:
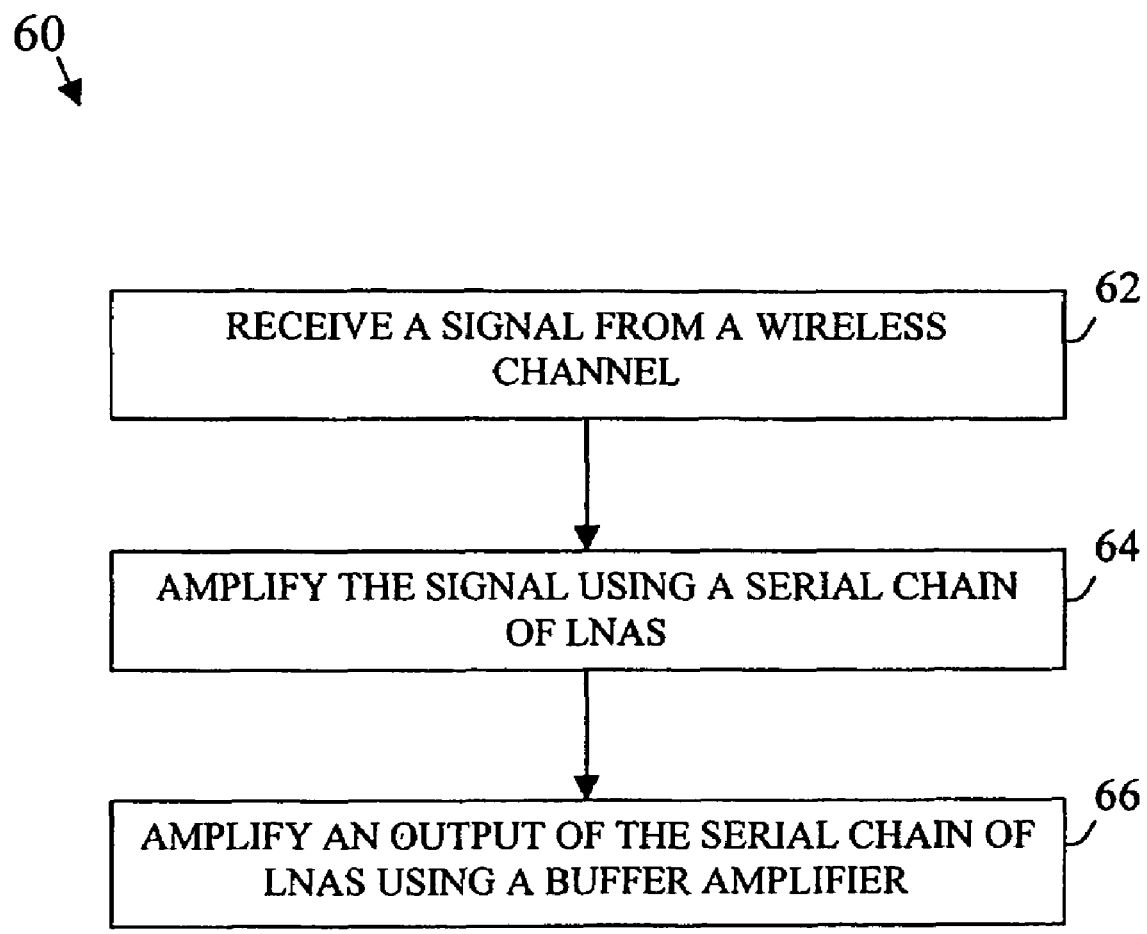
FIG. 4 is a flowchart illustrating an example method for use in performing low noise amplification in a receiver in accordance with an embodiment of the present invention.

FIG. 4 is a flowchart illustrating an example method for use in performing low noise amplification in a receiver in accordance with an embodiment of the present invention. First, a signal is received from a wireless channel (block 62). The received signal is amplified using a serial chain of LNAs (block 64). The serial chain of LNAs may include two or more individual LNAs. The LNAs in the serial chain may each be relatively narrowband amplifiers. Each of the LNAs may have a gain characteristic that is centered at a different frequency from the other LNAs in the chain. The overall gain characteristic of the serial chain of LNAs may be relatively wideband (i.e., compared to the individual LNA gain characteristics) and approximately flat over an operational bandwidth of interest. The output of the serial chain of LNAs maybe amplified using a buffer amplifier (block 66). The buffer amplifier may be a relatively wideband amplifier that is used to provide for output matching across the operational bandwidth of interest. The buffer amplifier may be a low gain device (although higher gain amplifiers may also be used) and does not need to have a low noise figure.

Features of the present invention maybe implemented within wireless devices, components, and/or systems following any wireless standard, including wireless networking standards and wireless cellular standards. In addition, inventive features may also be implemented within wireline systems. Features of the invention may be particularly beneficial in broadband systems, such as systems that will follow the Ultrawideband wireless networking standard that is currently being developed and other broadband standards.

In the foregoing detailed description, various features of the invention are grouped together in one or more individual embodiments for the purpose of streamlining the disclosure. This method of disclosure is not to be interpreted as reflecting an intention that the claimed invention requires more features than are expressly recited in each claim. Rather, as the following claims reflect, inventive aspects may lie in less than all features of each disclosed embodiment.

Although the present invention has been described in conjunction with certain embodiments, it is to be understood that modifications and variations may be resorted to without departing from the spirit and scope of the invention as those skilled in the art readily understand. Such modifications and variations are considered to be within the purview and scope of the invention and the appended claims.

What is claimed is:

1. A low noise amplification system comprising:
    a first low noise amplifier (LNA) having a first gain characteristic that is centered at a first center frequency; and
    a second LNA having a second gain characteristic that is centered at a second center frequency, said second center frequency being different from said first center frequency, wherein said second LNA is connected in series with said first LNA;
    wherein said low noise amplification system has an overall gain characteristic that is wider than said first and second gain characteristics individually.

2. The low noise amplification system of claim 1, further comprising:
    at least one other LNA connected in series with said first and second LNAs, said at least one other LNA having a gain characteristic that is centered at a center frequency that is different from said first and second center frequencies.

3. The low noise amplification system of claim 1, wherein:
said first LNA occurs before any other LNA within the serial connection of LNAs, wherein said first center frequency is higher than center frequencies associated with all other LNAs in the low noise amplification system.

4. The low noise amplification system of claim 1, wherein:
said overall gain characteristic is approximately flat over a relatively wide frequency band, wherein said relatively wide frequency band includes said first and second center frequencies.

5. The low noise amplification system of claim 1, further comprising:
a buffer amplifier that is connected in series with said first and second LNAs, wherein said buffer amplifier occurs last within a serial connection of amplifiers within said low noise amplification system.

6. The low noise amplification system of claim 5, wherein:
said buffer amplifier has a noise figure exceeding 1.5 dB.

7. The low noise amplification system of claim 5, wherein:
said buffer amplifier has a gain characteristic that is at least as wide as the overall gain characteristic of said low noise amplification system.

8. The low noise amplification system of claim 1, wherein:
said first and second LNAs each have noise figures that do not exceed 1.5 dB.

9. The low noise amplification system of claim 1, wherein:
said first and second LNAs are implemented using complementary metal oxide semiconductor (CMOS) technology.

10. A method comprising:
receiving a signal from a wireless channel; and
amplifying said signal using a serial chain of low noise amplifiers (LNAs), said serial chain of LNAs including at least a first LNA and a second LNA, wherein said first LNA has a gain characteristic that is centered at a first center frequency and said second LNA has a gain characteristic that is centered at a second center frequency, said second center frequency being different from said first center frequency;
wherein said serial chain of LNAs has an overall gain characteristic that is wider in frequency than said gain characteristics of said first and second LNAs individually.

11. The method of claim 10, wherein:
said overall gain characteristic of said serial chain of LNAs is approximately flat across an operational bandwidth thereof.

12. The method of claim 10, wherein:
said serial chain of LNAs includes at least one other LNA in addition to said first and second LNAs.

13. The method of claim 10, wherein:
said first LNA occurs at a beginning of said serial chain of LNAs, wherein said first center frequency is greater than center frequencies associated with all other LNAs within said serial chain of LNAs.

14. The method of claim 10, wherein:
said first and second LNAs each have noise figures that do not exceed 1.5 dB.

15. The method of claim 10, wherein:
said first and second LNAs are implemented using complementary metal oxide semiconductor (CMOS) technology.

16. The method of claim 10, further comprising:
amplifying an output of said serial chain of LNAs using a buffer amplifier, wherein said buffer amplifier has a gain characteristic that is at least as wide as said overall gain characteristic of said serial chain of LNAs.

17. A wireless communication device comprising:
at least one dipole antenna; and
a low noise amplification system, coupled to said at least one dipole antenna, comprising:
a first low noise amplifier (LNA) having a first gain characteristic that is centered at a first center frequency; and
a second LNA having a second gain characteristic that is centered at a second center frequency, said second center frequency being different from said first center frequency, wherein said second LNA is connected in series with said first LNA;
wherein said low noise amplification system has an overall gain characteristic that is wider than said first and second gain characteristics individually.

18. The wireless communication device of claim 17, further comprising:
at least one other LNA having a gain characteristic that is centered at a center frequency that is different from said first and second center frequencies, wherein said at least one other LNA is connected in series with said first and second LNAs.

19. The wireless communication device of claim 17, wherein:
said first LNA occurs before any other LNA within a serial connection of LNAs, wherein said first center frequency is higher than center frequencies associated with all other LNAs in the low noise amplification system.

20. The wireless communication device of claim 17, wherein:
said low noise amplification system further comprises a buffer amplifier that is connected in series with said first and second LNAs, wherein said buffer amplifier occurs after said first and second LNAs within a serial connection of amplifiers within said low noise amplification system.

21. The wireless communication device of claim 17, wherein:
said first and second LNAs are implemented using complementary metal oxide semiconductor (CMOS) technology.

22. The wireless communication device of claim 17, wherein:
said wireless communication device is a computer having wireless networking capability.

23. The wireless communication device of claim 17, wherein:
said wireless communication device is a personal digital assistant having wireless networking capability.

24. The wireless communication device of claim 17, wherein:
said wireless communication device is a wireless network interface module.

* * * * *